United States Patent
Uegaki et al.

(10) Patent No.: US 7,411,780 B2
(45) Date of Patent: Aug. 12, 2008

(54) PASTE, DISPLAY MEMBER, AND PROCESS FOR PRODUCTION OF DISPLAY MEMBER

(75) Inventors: Hiroko Uegaki, Kusatsu (JP); Norikazu Tabata, Otsu (JP); Takai Masaki, Otsu (JP); Hiromitsu Takahashi, Otsu (JP); Akihiko Tanaka, Otsu (JP); Mitsuyo Hashimoto, Kusatsu (JP)

(73) Assignee: Toray Industries, Inc., Tokyo (JP)

( * ) Notice: Subject to any disclaimer, the term of this patent is extended or adjusted under 35 U.S.C. 154(b) by 467 days.

(21) Appl. No.: 10/952,909

(22) Filed: Sep. 30, 2004

(65) Prior Publication Data

US 2005/0079447 A1 Apr. 14, 2005

Related U.S. Application Data

(62) Division of application No. 09/861,680, filed on May 22, 2001, now Pat. No. 7,004,812.

(30) Foreign Application Priority Data

May 23, 2000 (JP) ............................. 2000-151327
Jun. 19, 2000 (JP) ............................. 2000-182707
Sep. 29, 2000 (JP) ............................. 2000-298990

(51) Int. Cl.
 *H01G 9/02* (2006.01)
(52) U.S. Cl. .................. 361/525; 361/523; 361/528; 361/529; 361/516; 361/519; 252/62.2
(58) Field of Classification Search .................. 445/51, 445/52, 54, 23–26; 313/582, 586; 361/523–525, 361/528–534, 516–519, 502–512; 252/62.2
See application file for complete search history.

(56) References Cited

U.S. PATENT DOCUMENTS

| | | | | |
|---|---|---|---|---|
| 5,424,355 | A * | 6/1995 | Uemae et al. ............... | 524/507 |
| 5,840,465 | A | 11/1998 | Kakinuma et al. | |
| 5,874,041 | A | 2/1999 | Matsumura et al. | |
| 5,997,377 | A | 12/1999 | Sagara et al. | |
| 6,149,482 | A | 11/2000 | Sakasegawa et al. | |
| 6,197,480 | B1 | 3/2001 | Iguchi et al. | |
| 6,214,488 | B1 * | 4/2001 | Helmer-Metzmann et al. ............ | 429/29 |
| 6,261,144 | B1 | 7/2001 | Nishiki et al. | |
| 6,306,559 | B1 | 10/2001 | Tanamura et al. | |
| 6,439,943 | B1 | 8/2002 | Aoki et al. | |
| 6,555,594 | B1 * | 4/2003 | Fukushima et al. ........... | 522/81 |
| 6,841,299 | B2 * | 1/2005 | Wariishi ..................... | 429/188 |
| 7,004,812 | B2 * | 2/2006 | Uegaki et al. ................. | 445/51 |
| 7,154,737 | B2 * | 12/2006 | Maruo et al. ................. | 361/502 |
| 7,167,353 | B2 * | 1/2007 | Yuyama et al. ............. | 361/502 |

FOREIGN PATENT DOCUMENTS

| | | |
|---|---|---|
| EP | 0 775 940 A1 | 5/1997 |
| GB | 1 411 695 | 10/1975 |
| JP | 09-310030 | 12/1997 |

* cited by examiner

*Primary Examiner*—Nguyen T Ha
(74) *Attorney, Agent, or Firm*—Morrison & Foerster LLP

(57) ABSTRACT

A display member, particularly a plasma display member, can be produced by a process including applying a paste which includes a urethane compound and inorganic fine particles onto a substrate and then firing the paste. The display member has a post-firing pattern without any defect.

8 Claims, No Drawings

PASTE, DISPLAY MEMBER, AND PROCESS FOR PRODUCTION OF DISPLAY MEMBER

REFERENCE TO RELATED APPLICATION

This application is a division of Ser. No. 09/861,680, filed May 22, 2001, now U.S. Pat. No. 7,004,812.

BACKGROUND OF THE INVENTION

1. Field of the Invention

The present invention relates to a paste and a process for the production of a display member using the paste. The paste and the process of the present invention can be used for the production of various types of displays, including a plasma display, a plasma address liquid crystal display and a field emission display, and for the pattern processing in circuit materials and so on.

2. Description of the Related Art

In the fields of displays and circuit materials, increasingly small and high-definition products have been recently developed and pattern processing techniques adaptable to such development have been demanded. In particular, for the production of a barrier rib for a plasma display, methods have been demanded which enable the pattern processing of inorganic materials, such as glass, with high accuracy and high aspect ratio.

Heretofore, for the pattern processing of inorganic materials, methods have been proposed in which pattern formation is performed using a photosensitive paste by photolithography technique, as disclosed in Japanese Unexamined Patent Application Publication No. 9-310030 and U.S. Pat. No. 6,197,480.

However, the methods have such a problem that a firing shrinking force caused by the crosslinking of an organic component is generated at the time of removing the organic component by firing, leading to the occurrence of defects such as peeling and line breaking of the pattern. The present inventors have made intensive and extensive studies for the purpose of providing a paste which causes no defect such as peeling and line breaking during firing. As a result, the present invention has been accomplished.

SUMMARY OF THE INVENTION

Accordingly, it is an object of the present invention to provide a paste comprising a urethane compound and inorganic fine particles.

It is another object of the present invention to provide a paste comprising inorganic fine particles and an organic component, wherein, when the paste is heated to 500° C. and 1,000° C., the weights of the paste at these temperatures satisfy the following equation:

(weight at 500° C.)/(weight at 1,000° C.)≦1.05.

It is another object of the present invention to provide a paste comprising inorganic fine particles and an organic component, when the paste is applied onto a silicon wafer into a thin film and then heated to 500° C., the maximum value of the average film stress calculated based on the quantity of warping of the silicon wafer caused by shrinkage of the thin film being from 0.1 to 20 MPa.

It is another object of the present invention to provide a process for producing a display member, comprising applying a paste comprising a urethane compound and inorganic fine particles onto a substrate and then firing the paste.

It is another object of the present invention to provide a process for producing a display, particularly a plasma display, using the paste.

DESCRIPTION OF THE PREFERRED EMBODIMENTS

The paste according to the present invention comprises an organic component and inorganic fine particles. In the present invention, the "organic component" refers to the component or components in the paste except the inorganic fine particles. The paste of the present invention can be used for the formation of a pattern consisting substantially of inorganic material(s) in such a manner that the pattern is formed with the paste by any of various methods and the pattern is then fired to remove the organic component, thereby forming the pattern.

The pattern consisting substantially of the inorganic material(s) produced using the paste of the present invention can be preferably used in a display, particularly as a barrier rib of the rear plate of a display panel for a plasma display.

In addition to the urethane compound and the inorganic fine particles, the paste used in the present invention may contain a binder polymer, a dispersing agent, a plasticizer, a thickener, an organic solvent, a precipitation preventive agent, an antioxidant and so on, as required.

The urethane compound which may be used in the present invention preferably has a molecular weight ranging from 15,000 to 50,000. As used herein, the term "molecular weight" refers to a weight average molecular weight. When the molecular weight of the urethane compound is 15,000 or higher, the flexibility of the urethane can be maintained and defects such as peeling of patterned portions and line breaking during firing can be decreased to a larger extent. When the molecular weight of the urethane compound is 50,000 or lower, the viscosity of the urethane can be decreased so that the urethane becomes easy to handle.

The urethane compound which may be used in the present invention includes, for example, a compound represented by formula (1):

$$R^1-(R^4-R^3)_n-R^4-R^2 \qquad (1)$$

wherein $R^1$ and $R^2$ are independently selected from the group consisting of a substituent having an ethylenic unsaturated group, a hydrogen atom, a $C_1$-$C_{20}$ alkyl group, a $C_1$-$C_{20}$ aryl group, a $C_1$-$C_{20}$ aralkyl group and a $C_1$-$C_{20}$ hydroxyaralkyl group; $R^3$ is an alkylene oxide group or an alkylene oxide oligomer; $R^4$ is an organic group having a urethane bond; and n is an integer of from 1 to 10.

The urethane compound preferably contains an ethylene oxide unit. More preferably, the $R^3$ in formula (1) is an oligomer containing an ethylene oxide unit and a propylene oxide unit, and the content of the ethylene oxide unit in the oligomer is in the range of from 8 to 70 wt %. When the content of the ethylene oxide unit is 70 wt % or smaller, the flexibility of the urethane can be improved and the stress caused at the time of barrier rib formation can be reduced. As a result, occurrence of defects such as line breaking of the barrier rib can be prevented effectively. In addition, a property of thermal decomposition can be improved, reducing the firing residues in the firing process after the barrier rib formation. When the content of the ethylene oxide unit is 8 wt % or higher, the compatibility of the urethane compound with other organic components can be improved. The compatibility among the organic components can be determined based on the haze of a coating film formed by applying the organic components. A smaller haze value indicates a better compatibility in which the organic components are more sufficiently dissolved in each other. It is preferred that a film on which the organic components are applied at a thickness of 30 μm show a haze value of not larger than 5.0%. In the present invention, the haze is determined by "the test method for optical properties of a plastic" in accordance with JIS K7105. In this method, the haze (H; in %) can be determined by measuring a diffusion transmittance (Td) and a total transmittance (Tt) using an integrating sphere ray transmittance measuring apparatus and then calculating the ratio between them [i.e., H=(Td/Tt)×100]. More preferably, the haze is not larger than 0.8%, still more preferably not larger than 0.5%.

R4, the organic group having a urethane bond, is preferably produced by condensation between a diisocyanate group and a hydroxyl group. A component having the diisocyanate group which may be used in the condensation reaction includes an aliphatic diisocyanate compound (e.g., 1,4-diisocyanatobutane and 1,6-diisocyanatohexane); an aromatic diisocyanate compound (e.g., 1,4-phenylene diisocyanate and tolylene diisocyanate); and an alicyclic diisocyanate compound (e.g., 1,4-cyclohexylene diisocyanate and isophorone diisocyanate). Among these, more preferred is, but not limited to, an alicyclic diisocyanate compound, particularly isophorone diisocyanate.

Specific examples of the urethane compound include, but are not limited to, UA-2235PE (M.W.: 18,000, EO content: 20%), UA-3238PE (M.W.: 19,000, EO content: 10%), UA-3348PE (M.W.: 22,000, EO content: 15%), UA-2349PE (M.W.: 27,000, EO content: 7%), UA-5348PE (M.W.: 39,000, EO content: 23%), all of these products being made by SHINNAKAMURA KAGAKU KOGYO KK. These compound may be used in combination.

The content of the urethane compound is preferably 0.1 to 20 wt % based on the weight of the paste. The content of not lower than 0.1 wt % enables to provide a satisfactory peeling-preventing effect. If the content is higher than 20 wt %, then the dispersibility of the organic component and the inorganic fine particles may be reduced and, as a result, defects are liable to occur.

The paste used in the present invention may additionally contain a reactive monomer, a reactive oligomer, a reactive polymer, a photopolymerization initiator, a photo acid generating agent, a photo base generating agent, a sensitizer, a sensitizing auxiliary, an ultraviolet ray absorber, an organic dye, an acid, a base and so on, so that the paste can be used as a photosensitive paste. As used herein, the term "reactive" used in "a reactive monomer", "a reactive oligomer" and "a reactive polymer" means that, when the paste is irradiated with an active light, the reactive monomer, the reactive oligomer or the reactive polymer causes a reaction, such as photo-crosslinking, photopolymerization, photo-depolymerization or photo-denaturation, to thereby change the chemical structure of the paste. In this case, a display member may be produced using the paste by photolithography technique.

Each of the reactive monomer, reactive oligomer and reactive polymer preferably has an ethylenic unsaturated bond therein. More preferably, the ethylenic unsaturated bond is contained in the paste in a concentration of from 0.2 to 1.0 mol per kg of the paste which has yet not been irradiated with an active light. When the concentration of the ethylenic unsaturated bond in the paste is 0.2 mol or higher, the sensitivity of the paste can be maintained and a good pattern-forming property can be achieved. When the concentration of the ethylenic unsaturated bond is 1.0 mol or lower, the density of crosslinking at the time of pattern formation can be maintained in a proper range and binder removability becomes good. In addition, the polymerization shrinkage caused by application of light or heat can be reduced and, as a result, peeling of the patterned portions or line breaking can be largely prevented.

The paste of the present invention preferably further contains an amine compound having an ethylenic unsaturated group therein as the reactive monomer. It is particularly preferable to contain at least one of the amine compounds represented by formula (3) and (4), since the sensitivity of the paste to light may be improved:

$$R^5R^6R^7N \quad (3);$$

and $$R^5R^6N\text{-}M\text{-}NR^7R^8 \quad (4)$$

wherein $R^5$ is a substituent having an ethylenic unsaturated group: $R^6$, $R^7$ and $R^8$ are independently selected from the group consisting of a substituent having an ethylenic unsaturated group, a hydrogen atom, a $C_1$-$C_{20}$ alkyl group, a $C_1$-$C_{20}$ aryl group, a $C_1$-$C_{20}$ aralkyl group and a $C_1$-$C_{20}$ hydroxyalkyl group; and M is a bivalent linkage group.

The substituent $R^5$ containing an ethylenic unsaturated group in the amine compound is preferably represented by any one of formula (5), (6) and (7):

$$CH_2=CR^9\text{-}A\text{-}(L)_a\text{-}CH(OH)\text{-}CH_2\text{-} \quad (5);$$

$$CH_2=CR^9\text{-}(A)_b\text{-}(L)_a\text{-}SO_2\text{-} \quad (6);$$

and $$CH_2=CR^9\text{-}(A)_b\text{-}(L)_a\text{-}CO_2\text{-} \quad (7)$$

wherein $R^9$ is a hydrogen atom or a methyl group; A is COO, CONH or a substituted or unsubstituted phenylene group; L is selected from the group consisting of a $C_1$-$C_{20}$ cyclic or acyclic alkylene group, a $C_1$-$C_{20}$ cyclic or acyclic arylene group and a $C_1$-$C_{20}$ cyclic or acyclic aralkylene group, which may be unsubstituted or substituted with a $C_1$-$C_6$ alkyl group, a halogen atom, a hydroxyl group, an aryl group and so on; and each of a and b is 0 or 1.

More preferably, $R^9$ is $CH_2=C(CH_3)COOCH_2CH(OH)CH_2\text{-}$.

The amine compound which may be used is preferably an tertiary amine compound. A particularly preferable example of the compound is represented by formula (8):

$$(CH_2=CR^{10}\text{-}CO\text{-}Z)_{3-m}\text{-}NR'_m \quad (8)$$

wherein $R^{10}$ is a hydrogen atom or a methyl group; R' is an alkyl, aryl, aralkyl or hydroxyalkyl group; Z is —O—R"— or —NHR"— wherein R" is an alkylene, arylene, aralkylene or hydroxyalkylene group; and m is 0, 1 or 2.

The most preferable amine compound which may be used in the present invention is bis(2-hydroxy-3-methacryloyloxypropyl)isopropylamine.

The amine compound having an ethylenic unsaturated bond may be prepared by reacting glycidyl acrylate, glycidyl methacrylate, acryloyl chloride, methacryloyl chloride, acrylic anhydride, methacrylic anhydride or the like each having an ethylenic unsaturated bond therein with an amino compound. A plurality of compounds each having an ethylenic unsaturated bond may be used in combination. The amine compound having an ethylenic unsaturated bond may be, but are not limited to, those compounds as mentioned above, and may be used in combination.

In the present invention, a reactive monomer having an ethylenic unsaturated bond other than the above-mentioned amine compounds may be used, as required. The reactive monomer may be a monomer having therein at least one photopolymerizable acrylate, methacrylate or allyl group.

Specific examples of the monomer include an acrylate or methacrylate of an alcohol (e.g., ethanol, propanol, hexanol, octanol, cyclohexanol, glycerol, trimethylolpropane and pentaerythritol); a reaction product of a carboxylic acid (e.g., acetic acid, propionic acid, benzoic acid, acrylic acid, methacrylic acid, succinic acid, maleic acid, phthalic acid, tartaric acid and citric acid) with glycidyl acrylate, glycidyl methacrylate, acrylglycidyl or tetraglycidyl methaxylilenediamine; an amide derivative (e.g., acrylamide, methacrylamide, N-methylolacrylamide, methylene-bis(acrylamide)); and a reaction product of an epoxy compound with acrylic or methacrylic acid. In a polyfunctional monomer, the unsaturated group may be a combination among acrylic, methacrylic, vinyl and allyl groups. These compounds may be used singly or in combination.

As the reactive oligomer, it is preferable to use the urethane compound having an ethylenic unsaturated group therein. The ethylenic unsaturated group in the urethane compound can react with an ethylenic unsaturated group in a reactive monomer, a reactive polymer or the like, so that the urethane compound is incorporated in the crosslinking product. As a result, the polymerization shrinkage can be reduced more effectively.

The paste of the present invention may contain a copolymer having a carboxyl group therein.

For the preparation of the copolymer having a carboxyl group, for example, a monomer containing a carboxyl group (e.g., acrylic acid, methacrylic acid, itaconic acid, crotonic acid, maleic acid, fumaric acid, vinylacetic acid and the anhydrides of these compounds) or a monomer (e.g., a methacrylate, an acrylate, styrene, acrylonitrile, vinyl acetate and 2-hydroxyacrylate) may be selected and then subjected to copolymerization using an initiator such as azobisisobutyronitrile.

Preferable examples of the copolymer having a carboxyl group include a copolymer of an acrylate or methacrylate and acrylic acid or methacrylic acid as copolymerization components, because such a copolymer has a low thermal decomposition temperature during firing. Particularly preferable is styrene/methyl methacrylate/methacrylic acid copolymer.

The acid value of the copolymer having a carboxyl group is preferably in the range of from 50 to 150 mg KOH/g. When the acid value is 150 mg KOH/g or lower, the allowable range of development can be extended. When the acid value is 50 mg KOH/g or higher, the solubility of the unexposed regions in terms of the developer is not decreased. As a result, peeling of the exposed regions can be prevented and high-definition patterns can be obtained without the necessity of increasing the concentration of the developing solution.

It is also preferable the copolymer having a carboxyl group have an ethylenic unsaturated group in its side chain. Such an ethylenic unsaturated group includes an acrylic group, a methacrylic group, a vinyl group and an allyl group.

The addition of such a side chain to the copolymer can be achieved, for example, by the addition reaction between a mercapto group, an amino group, a hydroxyl group or a carboxyl group in the copolymer and an ethylenic unsaturated compound having a glycidyl or isocyanate group, acrylyl chloride, methacrylyl chloride or allyl chloride.

Examples of the ethylenic unsaturated compound having a glycidyl group include glycidyl acrylate, glycidyl methacrylate, allyl glycidyl ether, glycidyl ethyl acrylate, crotonyl glycidyl ether, crotonic acid glycidyl ether and isocrotonic acid glycidyl ether. Examples of the ethylenic unsaturated compound having an isocyanate group include acryloylisocyanate, methacryloylisocyanate, acryloylethylisocyanate and methacryloylethylisocyanate. The ethylenic unsaturated compound having a glycidyl or isocyanate group, acrylyl chloride, methacrylyl chloride or allyl chloride is preferably added in an amount of 0.05 to 1 mole equivalent for each equivalent of the mercapto group, amino group, hydroxyl group or carboxyl group in the polymer.

To achieve a proper exposure level, it is preferred to add the copolymer having a carboxyl group in an amount of 10 to 90 wt % based on the weight of the organic components except solvents.

When a binder component is needed, polyvinyl alcohol, polyvinyl butyral, a methacrylate polymer, an acrylate polymer, an acrylate-methacrylate copolymers or butyl methacrylate resin may be used as a polymer.

The photopolymerization initiator usable in the present invention may be selected from those initiators which can generate a radical species. Specific examples of the photopolymerization initiator include diethoxyacetophenone, 2-hydroxy-2-methyl-1-phenylpropan-1-one, benzyl dimethyl ketal, 1-(4-isopropylphenyl)-2-hydroxy-2-methylpropan-1-one, 4-(2-hydroxyethoxy)phenyl-(2-hydroxy-2-propyl)ketone, 1-hydroxycyclohexyl-phenyl ketone, 1-phenyl-1,2-propanedione-2-(o-ethoxycarbonyl)oxime, 2-methyl-[4-(methylthio)phenyl]-2-morpholynopropan-1-one, 2-benzyl-2-dimethylamino-1-(4-morpholynophenyl)-butanone-1, benzoin, benzoin methyl ether, benzoin ethyl ether, benzoin isopropyl ether, benzoin isobutyl ether, benzophenone, methyl o-benzoylbenzoate, 4-phenylbenzophenone, 4,4-dichlorobenzophenone, hydroxybenzophenone, 4-benzoyl-4'-methyl-diphenyl sulfide, alkylated benzophenone, 3,3',4,4'-tetra(t-butylperoxycarbonyl)benzophenone, 4-benzoyl-N,N'-dimethyl-N-[2-(1-oxo-2-propenyloxy)ethyl] benzenemethanaminium bromide, (4-benzoylbenzyl) trimethylammonium chloride, 2-hydroxy-3-(4-benzoylphenoxy)-N,N,N-trimethyl-1-propenaminium chloride monohydrate, 2-isopropylthioxanthone, 2,4-dimethylthioxanthone, 2,4-diethylthioxanthone, 2,4-dichlorothioxanthone, 2-hydroxy-3-(3,4-dimethyl-9-oxo-9H-thioxanthen-2-yloxy)-N,N,N-trimethyl-1-propanaminium chloride, 2,4,6-trimethylbenzoylphenylphosphine oxide, 2,2'-bis(o-chlorophenyl)-4,5,4',5'-tetraphenyl-1,2-biimidazole, 10-butyl-2-chloroacridone, 2-ethylanthraquinone, benzyl, 9,10-phenanthrequinone, camphorquinone, methylphenylglyoxyester, $\eta^5$-cyclopentadienyl-$\eta^6$-cumenyl-iron(1+)-hexafluorophosphate(1−), a dipheylsulfide derivative, bis($\eta^5$-2,4-cyclopentadien-1-yl)-bis(2,6-difluoro-3-(1H-pyrrol-1-yl)-phenyl) titanium, 4,4-bis(dimethylamino)benzophenone, 4,4-bis(diethylamino)benzophenone, thioxanthone, 2-methylthioxanthone, 2-chlorothioxanthone, 4-benzoyl-4-methylphenyl ketone, dibenzyl ketone, fluorenone, 2,3-diethoxyacetophenone, 2,2-dimethoxy-2-phenyl-2-phenylacetophenone, 2-hydroxy-2-methylpropiophenone, p-t-butyldichloroacetophenone, benzyl methoxyethyl acetal, anthraquinone, 2-t-butylanthraquinone, 2-aminoanthraquinone, β-chloroanthraquinone, anthrone, benzanthrone, dibenzosuberone, methyleneanthrone, 4-azidobenzalacetophenone, 2,6-bis(p-azidobenzylidene)cyclohexane, 2,6-bis(p-azidobenzylidene)-4-methylcyclohexanone, 2-phenyl-1,2-butadione-2-(o-methoxycarbonyl)oxime, 1,3-diphenylpropanetrione-2-(o-ethoxycarbonyl)oxime, naphthalenesulfonyl chloride, quinolinesulfonyl chloride, N-phenylthioacridone, 4,4-azobisisobutyronitrile, benzthiazole disulfide, triphenylphosphine, carbon tetrabromide, tribromophenylsulfone, benzoyl peroxide, and a combination of a photoreducing dye (e.g., Eosine or Methylene Blue) and a reducing agent (e.g., ascorbic acid or triethanolamine).

In the present invention, one or more of these compounds may be used. The photopolymerization initiator is preferably added in an amount of 0.05 to 10 wt %, more preferably 0.1 to 10 wt %, based on the total of the organic component. When the photopolymerization initiator is added within this range, a good photosensitivity can be achieved while maintaining a sufficient remaining ratio of the exposed regions.

A sensitizer may be used together with the photopolymerization initiator to improve the sensitivity and expand the wavelength range which is effective for the reaction. Specific examples of the sensitizer include 2,4-dimethylthioxanthone, 2,4-diethylthioxanthone, 2-isopropylthioxanthone, 2,3-bis(4-diethylaminobenzal)cyclopentanone,2,6-bis(4-dimethylaminobenzal)cyclohexanone, 2,6-bis(4-dimethylaminobenzal)-4-methylcyclohexanone, Michler's ketone, 4,4-bis(diethylamino)benzophenone, 4,4-bis(dimethylamino)chalcone, 4,4-bis(diethylamino)chalcone, p-dimethylaminocinnamylideneindanone, p-dimethylaminobenzylideneindanone, 2-(p-dimethylaminophenylvinylene)isonaphthothiazole, 1,3-bis(4-dimethylaminophenylvinylene)isonaphthothiazole, 1,3-bis(4-dimethylaminobenzal)acetone, 1,3-carbonylbis(4-diethylaminobenzal)acetone, 3,3-carbonylbis(7-diethylaminocoumarin), triethanolamine, methyldiethanolamine, truisopropanolamine, N-phenyl-N-ethylethanolamine, N-phenylethanolamine, N-tolyldiethanolamine, methyl 4-dimehylaminobenzoate, ethyl 4-dimehylaminobenzoate, isoamyl dimethylaminobenzoate, isoamyl diethylaminobenzoate, (2-dimethylamino)ethyl benzoate, (n-butoxy)ethyl 4-dimethylaminobenzoate, 2-ethylhexyl 4-dimethylaminobenzoate, 3-phenyl-5-benzoylthiotetrazole and 1-phenyl-5-ethoxycarbonylthiotetrazole.

In the present invention, one or more of these initiators may be used. Some of the sensitizers can also be used as photopolymerization initiators. The sensitizer is preferably added to the paste of the present invention in an amount of 0.05 to 10 wt %, more preferably 0.1 to 10 wt %, based on the weight of the organic component. When the amount of the sensitizer is in this range, a good photosensitivity can be achieved while maintaining a satisfactory remaining ratio of the exposed regions.

In the present invention, it is preferred to add an antioxidant to the paste. An antioxidant is a component having functions of radical polymerization inhibition, triplet scavenging and hydroperoxide decomposition.

When the paste is used for the production of a barrier rib for a plasma display member, numerous glass fine particles are present in the paste. Accordingly, occurrence of light scattering within the paste caused by exposure light cannot be avoided. As a result, spreading of the shape of a barrier rib pattern and filling of spaces between patterns (i.e., formation of film remnants) which are considered to be caused by such light scattering are liable to occur. It is desirable that the wall face of a barrier rib pattern have a rectangular shape which rises perpendicularly. Ideally, the paste coating film which has been exposed with light is dissolved in a developing solution at a certain exposure level or lower, but is not dissolved at an exposure level not lower than the certain exposure level. In other words, the coating film can be dissolved in a developing solution even at a low exposure level due to the light scattering and, therefore, spreading of the shape of a barrier rib pattern and filling of spaces between patterns hardly occur at a higher exposure level, advantageously expanding the range of the exposure level at which the development can be achieved.

An antioxidant may be added to the paste. In this case, the antioxidant can trap radicals and get the energy state of the excited photopolymerization initiator or sensitizer back to the ground state. As a result, any unnecessary photo-reaction caused by scattered light can be prevented, and a photo-reaction can occur rapidly at an exposure level which cannot be prevented by the antioxidant, leading to the production of a high contrast between dissolution and non-dissolution of the paste in the developing solution.

Specific examples of the antioxidant include, but are not limited to, p-benzoquinone, naphthoquinone, p-xyloquinone, p-toluquinone, 2,6-dichloroquinone, 2,5-diacetoxy-p-benzoquinone, 2,5-dicaproxy-p-benzoquinone, hydroquinone. p-t-butyl catechol, 2,5-dibutylhydroquinone, mono-t-butylhydroquinone, 2,5-di-t-amylhydroquinone, di-t-butyl-p-cresol, hydroqionone monomethyl ether, α-naphthol, hydrazine hydrochloride, trimethylbenzylammonium chloride, trimethylbenzylammonium oxalate, phenyl-β-naphthylamine, para-benzylaminophenol, di-β-naphthylparaphenylenediamine, dinitrobenzene, trinitrobenzene, picric acid, quinonedioxime, cyclohexanoneoxime, pyrogallol, tannic acid, triethylamine hydrochloride, dimethylaniline hydrochloride, cupferron, (2,2-thiobis(4-t-octylphenolate)-2-ethylhexylaminonickel-(II), 4,4'-thiobis-(3-methyl-6-t-butylphenol), 2,2'-methylenebis-(4'-methyl-6-t-butylphenol), 2,2'-thiobis-(4-methyl-6-t-butylphenol), triethyleneglycol-bis[3-(t-butyl-5-methyl-4-hydroxyphenyl)propionate], 1,6-hexanediol-bis[(3,5-di-t-butyl-4-hydroxyphenyl)propionate] and 1,2,3-trihydroxybenzene. In the present invention, one or more of these compounds can be used.

The amount of the antioxidant to be added is preferably 0.1 to 30 wt %, more preferably 0.5 to 20 wt %, based on the weight of the paste. When the amount of the antioxidant is in this range, the photo-sensitivity of the paste can be maintained and a satisfactory polymerization degree can be maintained. As a result, a high contrast between dissolution and non-dissolution of the paste in the developing solution can be achieved while maintaining the desired pattern shape.

The paste may contain an ultraviolet ray absorber to absorb scattered light within the paste caused irradiation with exposure light, resulting in weakening of the scattered light. The ultraviolet ray absorber may be a benzophenone compound, a cyanoacrylate compound, a salicylate compound, a benzotriazole compound, an indole compound, fine particulate inorganic metal oxide or the like. Among these, a benzophenone compound, a cyanoacrylate compound, a benzotriazole compound or an indole compound is particularly effective. Specific examples of these compounds include, but are not limited to, 2,4-dihyroxybenzophenone, 2-hydroxy-4-methoxybenzophenone, 2,2'-dihyroxy-4-methoxybenzophenone, 2,2'-dihydroxy-4,4'-dimethoxybenzophenone, 2,2'-dihydroxy-4,4'-dimethoxy-5-sulfobenzophenone, 2-hydroxy-4-methoxy-2'-carboxybenzophenone, 2-hydroxy-4-methoxy-5-sulfobenzophenone trihydrate, 2-hydroxy-4-n-octoxybenzophenone, 2-hydroxy-4-octadecyloxybenzophenone, 2,2',4,4'-tetrahydroxybenzophenone, 4-dodecyloxy-2-hydroxybenzophenone, 2-hydroxy-4-(2-hydroxy-3-methacryloxy)propoxybenzophenone, 2-(2'-hydroxy-5'-methylphenyl)benzotriazole, 2-(2'-hydroxy-3',5'-di-t-butylphenyl)benzotriazole, 2-(2'-hydroxy-3'-t-butyl-5'-methylphenyl)-5-chlorobenzotriazole, 2-(2'-hydroxy-3'-5'-di-t-butylphenyl)-5-chlorobenzotriazole, 2-(2'-hydroxy-4'-n-octoxyphenyl)benzotriazole, 2-ethylhexyl-2-cyano-3,3-diphenylacrylate, 2-ethyl-2-cyano-3,3-diphenylacrylate and commercially available indole-type absorbers, "BONASORB" UA-3901, "BONASORB" UA-3902 and SOM-2-0008 (all of these products are produced and soled by Orient Chemical Industries, Ltd.). Each of these ultraviolet ray absorbers may be used in a reactive form in which a methacrylic group or the like is introduced to its backbone. In the present invention, one or more of these compounds can be used.

The amount of the ultraviolet ray absorber to be added is 0.001 to 10 wt %, more preferably 0.005 to 5 wt %, based on the weight of the paste. When the amount of the ultraviolet ray absorber is in this range, the transmission threshold wavelength and the wavelength inclination width can be maintained in the desired ranges, and a satisfactory effect of absorbing scattered light can be achieved while maintaining satisfactory transmittance and sensitivity of the paste.

In the present invention, an organic dye may be added to the paste as a marker for the light exposure and development. When an organic dye is added to color the paste, a property of visual identification becomes good so that the regions where the paste remains and the regions where the paste is removed can be easily distinguished from each other at the time of development. The organic dye is preferably, but is not limited to, one which does not remain in the insulation film after firing. Specific examples of the organic dye include an anthraquinone dye, an indigoid dye, a phthalocyanine dye, a carbonium dye, a quinoneimine dye, a methine dye, a quinoline dye, a nitro dye, a nitroso dye, a benzoquinone dye, a naphthoquinone dye, a phthalimide dye and a perinone dye. A dye which can absorb light having a wavelength near h-line and i-line, such as a carbonium dye (e.g., Basic Blue), is particularly preferable, since the effectiveness of the present invention can be achieved more advantageously. The amount of the organic dye to be added is preferably 0.001 to 1 wt %.

To control the viscosity of the paste at the time of application onto a substrate depending on the application method employed, an organic solvent may be used. The organic solvent includes, for example, methylcellosolve, ethylcellosolve, butylcellosolve, methyl ethyl ketone, dioxane, acetone, cyclohexanone, cyclopentanone, isobutyl alcohol, isopropyl alcohol, tetrahydrofuran, dimethylsulfoxide, γ-butyrolactone, bromobenzene, chlorobenzene, dibromobenzene, dichlorobenzene, bromobenzoate, chlorobenzoate. The organic solvent may be used as a mixture of two or more of these solvents.

The paste of the present invention preferably contains the inorganic fine particles in an amount of 40 to 80 wt % based on the weight of the paste. If the organic component is contained too much, the amount of materials to be removed during the firing process is increased. As a result, the time required for the firing is prolonged and, therefore, it becomes difficult to convert the coating film into inorganic film completely. Moreover, since the firing shrinkage becomes large, the thickness of the film to be applied is needed to increase for the formation of a barrier rib with a desired size. Accordingly, too much organic component is disadvantageous from the viewpoint of pattern-forming properties. It is also disadvantageous from the viewpoint of maintaining the shape of the barrier rib. When the content of the organic component in the paste is too small, on the other hand, the inorganic fine particles cannot be mixed or dispersed in the paste sufficiently. Moreover, problems such as reduction in application property of the paste may occur due to the increased viscosity of the paste, affecting the stability of the paste. The dispersibility of the organic component and the inorganic fine particles is also reduced, leading to the occurrence of defects during the firing.

The inorganic fine particles preferably comprises 60 to 97 wt % of low melting glass powder and 3 to 40 wt % of a filler having a mean particle size of 1 to 4 μm. The filler is used together with the low melting glass to control the firing shrinkage and maintain the strength of the formed barrier rib. If the content of the filler in the inorganic fine particles is less than 3 wt %, then the effect of addition of the filler cannot be produced. If the content of the filler is more than 40 wt %, then the strength of the barrier rib will be reduced. The inorganic fine particles may optionally further contain not more than 30 wt % of oxide fine particles having a mean particle size of from 0.003 to 0.02 μm.

Each of the low melting glass powder and the filler preferably has a refraction index of from 1.45 to 1.65. In the paste, the inorganic fine particles are dispersed in the organic solvent in which the organic component is dissolved. Therefore, in the coating film of the paste, the inorganic fine particles are present in the organic component layer in a considerably high concentration. To form a pattern on the coating film by photolithography method, the components in the paste preferably have refraction indexes close to each other. The average refraction index of the organic component used in the paste generally lies in the range from 1.4 to 1.7. Therefore, it is preferred to select inorganic fine particles having a refraction index close to this range as possible. In a glass component comprising various oxides, the properties can be controlled by varying the formula of the glass component. In the present invention, low melting glass powder having controlled thermal properties, refraction index or the like can be used. The low melting glass powder preferably has a refraction index of from 1.45 to 1.65, a glass transition temperature of from 400 to 550° C. and a softening point under load of from 450 to 600° C. When the softening point under load is 450° C. or higher, deformation of the barrier rib can be prevented in any process which is performed after the display member production and the display production. When the softening point under load is 600° C. or lower, the glass powder can be melted during firing and a barrier rib having a high strength can be obtained.

The low melting glass powder preferably has a mean particle size of from 1 to 4 μm and the maximum particle size of 35 μm or smaller. This is because good filling property and dispersibility in the paste can be provided to the glass powder, application of the paste in an uniform thickness can be achieved and a good pattern-forming property can be maintained. The glass powder having such a particle size distribution is good in filling property and dispersibility in the paste. In the case where a low melting glass powder is used, since most of the powder is integrated during the firing process, the powder having considerably large particle sizes is acceptable. When the glass powder has a mean particle size in this range, the glass powder has satisfactory filling property and dispersibility, and a paste with good application property and pattern-forming property can be obtained.

The filler which may be used in the present invention is preferably at least one selected from high melting glass and cordierite having a controlled refraction index. The high melting glass powder is preferably has a glass transition temperature of 500 to 1200° C. and a softening point under load of 550 to 1200° C.

The paste of the present invention may be used as a conductive paste by using metal fine particles as the inorganic fine particles. When the conductive paste is used, a high-definition circuit pattern having less defects can be produced. The conductive paste can be used for the formation of an electrode for a plasma display, for example.

Preferred examples of the metal fine particles include conductive fine particles of a noble metal such as Au, Ni, Ag, Pd and Pt. These metal fine particles may be used singly or in combination. The metal fine particles may contain Cr or Rh to improve the properties of the paste at high temperatures.

When the paste is used as a photosensitive conductive paste, it is preferred that the metal fine particles in the paste have a mean particle size of from 0.5 to 5 μm. If the particle size is less than 0.5 μm, then ultraviolet ray used for the exposure cannot smoothly pass through the film applied and it becomes difficult to form a very fine pattern having a line width of 60 μm or less of a good conductor. If the particle size is more than 5 μm, then the surface of the circuit pattern after the application becomes rough and, as a result, the accuracy of the pattern is reduced, causing noise. The metal fine particles preferably have a specific surface of from 0.1 to 3 m$^2$/g. If the specific surface is less than 0.1 m$^2$/g, then the accuracy of the circuit pattern will be reduced. If the specific surface is more than 3 m$^2$/g, then the surface areas of the fine particles will become too large and, as a result, ultraviolet ray may be scattered, causing the reduction in accuracy of the pattern.

The shape of the individual metal fine particles may be of flake-type (e.g., plate-type, cone-type and rod-type) or sphere-type. However, sphere-type shape is preferred because aggregation of the particles can be prevented and scattering of ultraviolet ray during the exposure can be reduced.

When the paste of the present invention is heated to 500° C. and 1,000° C. at a rate of 10° C./min, it is preferred that the weights of the paste at these temperature as determined using a thermogravimetric analyzer satisfy the following equation:

(weight at 500° C.)/(weight at 1,000° C.)≦1.05.

A smaller ratio of the weight at 500° C. to the weight at 1,000° C. indicates that the binder removability of the organic component is better. When the ratio is 1.05 or lower, the organic component remaining in the barrier rib is decreased and the reliability of the resulting display can be improved. The weight ratio can be reduced by the addition of a urethane compound to the paste. In particular, the addition of a urethane compound having an ethylene oxide content falling within the above-mentioned range is preferable, since the weight ratio is reduced to more extent. When the paste contains an compound having an ethylenic unsaturated group, the weight ratio can be controlled by controlling the concentration of the ethylenic unsaturated group.

When the paste of the present invention is applied on a silicon wafer into a thin film having a thickness of 3 to 10 μm and then heated to 30 to 500° C. over 1 hour, it is preferred that the maximum value of the average film stress calculated based on the quantity of warping of the silicon wafer caused by shrinkage of the thin film in accordance with the following equation be in the range of from 0.1 to 20 MPa, more preferably from 0.1 to 10 MPa:

average film stress σ (Pa)=$Eh^2/(1-v)6Rt$ wherein E/(1−v) is a biaxial elastic modulus of a substrate and is 1.805×10$^{-11}$ Pa for a silicon wafer; h is a thickness (m) of the substrate; R is a radius of curvature (m) of the substrate; and t is a thickness of a thin film.

When the maximum value of the average film stress is in the range of from 0.1 to 20 MPa, the shrinkage during the firing can be prevented and defects caused by firing (e.g., peeling and line breaking) can be reduced. When the maximum value of the average film stress is in the range of from 0.1 to 10 MPa, defects caused by firing can be reduced to more extent. The average film stress can be controlled by the addition of a urethane compound to the paste. When the paste contains a compound having an ethylenic unsaturated group, the average film stress can be controlled by controlling the concentration of the ethylenic unsaturated group.

The paste can be prepared by blending various components, such as a binder polymer, a dispersing agent, a plasticizer, a thickener, an organic solvent, a precipitation preventing agent, an antioxidant, a reactive monomer, a reactive oligomer, an reactive polymer, a photopolymerization initiator, a photo acid generating agent, a photo base generating agent, a sensitizer, a sensitizing auxiliary, an ultraviolet ray absorber, an organic dye, an acid, a base and an organic solvent, in a desired composition, and then mixing and dispersing these components homogeneously using a triple roller or a kneader.

The viscosity of the paste may be properly controlled by varying the blending ratio of the inorganic fine particles, the thickener, the organic solvent, the plasticizer or the precipitation preventing agent in the paste, and is preferably in the range of from 2,000 to 200,000 cps (centipoises). For example, in the case where spin coating method is employed for the application of the paste onto a substrate, it is preferable to adjust the viscosity to 2,000 to 5,000 cps. In the case where screen printing method is employed for the application of the paste onto a substrate and a thin film having a thickness of 10 to 20 μm is to be formed in one application step, it is preferable to adjust the viscosity to 50,000 to 200,000 cps. In the case where blade coater method or die coater method is employed, it is preferable to adjust the viscosity to 10,000 to 50,000 cps.

The paste of the present invention prepared as mentioned above is applied onto a substrate, a pattern is formed using any one of various methods and then the formed pattern is fired, to thereby produce a display member. The paste of the present invention is particularly suitable for the production of a plasma display member having barrier ribs on a substrate. A preferred method for the pattern formation to be employed in the present invention is, for example, screen printing method, sandblasting method or photolithography method. Among these, photolithography method is particularly preferred since a highly precise processing can be achieved.

An embodiment for the production of a display member using the paste by photolithography method will be described as follows. However, it is to be understood that the invention is not intended to be limited to the embodiment.

The paste is applied over the entire surface or a part of a substrate to form a coating film. The application of the paste may be performed using screen printing method, bar coater method, roll coater method, die coater method, blade coater method or the like. The thickness of the coating film can be controlled by selecting the time of applications, the mesh size of a screen and the viscosity of the paste.

When the paste is applied onto the substrate, the surface of the substrate may be treated to achieve a close contact between the substrate and the coating film. The agent which may be used for such surface treatment includes a silane coupling agent such as vinyl trichlorosilane, vinyl trimethoxy silane, vinyl triethoxy silane, tris(2-methoxyethoxy)vinyl silane, γ-glycidoxypropyl trimethoxy silane, γ-(methacryloxypropyl)trimethoxy silane, γ-(2-aminoethyl)aminopropyl trimethoxy silane, γ-chloropropyl trimethoxy silane, γ-mercaptopropyl trimethoxy silane, and γ-aminopropyl triethoxy silane; and an organic metal compound such as an organic titanium compound, an organic aluminum compound and an organic zirconium compound. The silane coupling agent or organic metal compound is used in the form of a 0.1-5% solution in an organic solvent such as ethylene glycol monomethyl ether, ethylene glycol monoethyl ether, methyl alcohol, ethyl alcohol, propyl alcohol and butyl alcohol. Subsequently, the surface treatment solution is applied uniformly over the substrate by means of a spinner or the like, followed by drying at 80 to 140° C. for 10 to 60 min. to achieve the surface treatment.

After the application of the paste onto the substrate is completed, the coating film is exposed with light using an exposure device. The exposure device which may be used is a proximity exposer or the like. In the case where a large area is to be exposed, the paste is applied onto the substrate and then the exposure may be performed while conveying the paste-applied substrate, whereby the exposure of such a large area can be achieved even using an exposure device with a small light source.

After the exposure is completed, development is performed utilizing the difference in solubility in a developing solution between the exposed regions and the unexposed regions of the coating film. The development may be performed by dipping method, spraying method, brushing method or the like. As the developing solution, an organic solvent may be used into which the organic component in the paste can dissolve. Water may be added to the organic solvent in such an amount that the solubility of the organic component in the organic solvent is not impaired. It is preferred that the developing solution mainly consist of water. When a compound having an acidic group (e.g., a carboxyl group) is present in the paste, the development can be performed with an aqueous alkaline solution. As the aqueous alkaline solution, an aqueous solution of sodium hydroxide, sodium carbonate, calcium hydroxide or the like may be used. However, it is preferred to use an aqueous solution of an organic alkaline compound for easy removal of alkaline components during the firing.

The organic alkaline compound may be a common amine compound. Specific examples of the amine compound include tetramethylammonium hydroxide, trimethylbenzylammonium hydroxide, monoethanol amine and diethanol amine.

The concentration of the alkaline solution is generally in the range of from 0.05 to 5 wt %, more preferably 0.1 to 1 wt %. If the alkali concentration is too low, then the soluble portions will not be removed. If the alkali concentration is too high, then peeling of patterned portions and corrosion of soluble portions will occur. The temperature for development is preferably 20 to 50° C., from a process control viewpoint.

Subsequently, firing is performed in a firing furnace. The atmosphere and temperature for firing may depend on the types of the paste and substrate used. Firing is generally performed in an atmosphere of air, nitrogen, hydrogen or the like. The firing furnace which may be used is a batch-type firing furnace or a belt-type continuous firing furnace.

The firing is generally performed at a temperature of 400 to 1,000° C. In the case where a pattern is formed on a glass substrate, it is preferable to maintain the temperature for firing at 480 to 610° C. for 10 to 60 min. to ensure the firing.

According to the process as mentioned above, a display member can be produced which has a pattern consisting substantially of inorganic materials formed on a substrate.

Hereinbelow, the present invention will be described in more detail with reference to the following examples. However, it is to be understood that the invention is not intended to be limited to the examples. Unless otherwise stated, concentrations (%) are expressed as wt % (percent by weight).

EXAMPLES 1 TO 10, COMPARITIVE EXAMPLES 1 AND 2

A urethane and a polymer solution shown in Table 1, a dispersing agent (3 wt %), a leveling agent (3 wt %) and dipropylene glycol monomethyl ether (4 wt %) were dissolved in each other while heating to 50° C. to prepare an organic solution the organic solution was applied onto a glass substrate and then dried at 100° C. for 90 min to form a coating film having a thickness of 30 µm. The haze of the coating film was measured using a direct-reading haze computer HGM-2DP (A product of Suga Test Instruments Co. Ltd.). The measured value for each sample is shown in Table 2.

To the organic solution was added inorganic fine particles shown in Table 1. The resulting mixture was kneaded using a kneader to prepare a paste.

The paste was heated to 500° C. and 1,000° C. at a rate of 10° C./min. Each of the weights at these temperatures was determined in an air atmosphere using a thermogravimetric analyzer "TGA-50" (a product of Shimadzu Corporation). The determined value of (weight at 500° C.)/(weight at 1,000° C.) for each sample is shown in Table 2.

Subsequently, the paste was applied onto a silicon wafer (diameter: 100±0.5 mm, thickness: 525±25 µm;, a product of Shin-Etsu Handotai Co., Ltd.) to form a coating film having a thickness of 3 to 10 µm. The coating film was heated to 30 to 500° C. over 1 hour, and the stress of the coating film generated during this period was measured using a thin film stress meter "F2300S" (a product of FLEXUS). The maximum value among the measured stress values for each sample is shown in Table 2.

Separately, the paste was applied onto a glass substrate to form a coating film having a thickness of 50 µm. The coating film was fired at 560° C. for 15 min. After firing, the reflectance of the film which consisted substantially of inorganic materials was determined using an automatically recording spectrophotometer (a product of Hitachi Ltd.). The determined value for each sample is shown in Table 2.

Stripe-shaped address silver electrodes (line width: 100 µm, thickness: 3 µm, pitch: 500 µm) were formed on a glass substrate (diagonal size: 42 inches), and a dielectric layer was then formed thereon. The paste was used to perform the screen printing of a lower layer. A screen printing plate for the formation of a grid-shaped barrier rib pattern for a plasma display (each transversal barrier rib: line width 500 µm, pattern pitch 1,000 µm; each longitudinal barrier rib: line width 60 µm, pattern pitch 500 µm) was arranged so that every transversal barrier rib and every address electrode cross each other at right angle. The printing and drying of the paste were repeated 5 to 6 times while taking alignment until the dry thickness of the upper layer became 90 µm.

The paste was used to perform screen printing of a stripe pattern of an upper layer on the grid-shaped barrier rib pattern of the lower layer. A screen printing plate (each transversal barrier rib: line width 60 µm, pattern pitch 500 µm) was arranged so that every stripe line and every address electrode became parallel to each other. The printing and drying of the paste were repeated 5 to 6 times while taking alignment until the dry thickness of the upper layer reached 90 µm.

The grid-shaped barrier rib pattern formed as above was further fired at 560° C. for 15 min. to produce a display member having grid-shaped barrier ribs formed by the stripe-shaped barrier ribs (pitch: 500 μm, line width: 60 μm, height: 130 μm) and the auxiliary barrier ribs (pitch: 1,000 μm, line width: 500 μm. height: 60 μm) crossing over the stripe-shaped barrier ribs at right angle. After firing, the presence of defects including peeling and line breaking was observed. The results are shown in Table 2.

shown in Table 2. In the results, the increased voltage was classified into three levels as follows:

stable: the voltage was increased by 1 V or less;

slightly increased: the voltage was increased by 2 to 3 V; and increased: the voltage was increased by 4 V or more.

TABLE 1

|  | Urethane | | | | Polymer solution | | Low melting glass | Filler | Oxide fine particles |
| --- | --- | --- | --- | --- | --- | --- | --- | --- | --- |
|  | Type | Amount (%) | Weight mean M.W. | EO content | Type | Amount (%) | Amount (%) | Amount (%) | Amount (%) |
| Ex. 1 | I | 10 | 18000 | 30% | I | 20 | 60 | — | — |
| Ex. 2 | II | 10 | 19000 | 10% | II | 20 | 40 | 20 | — |
| Ex. 3 | III | 10 | 42000 | 0% | I | 20 | 60 | — | — |
| Ex. 4 | IV | 10 | 27000 | 7% | II | 20 | 40 | 17 | 3 |
| Ex. 5 | V | 10 | 24000 | 80% | I | 20 | 60 | — | — |
| Ex. 6 | VI | 10 | 1200 | 50% | II | 20 | 60 | — | — |
| Ex. 7 | I | 0.05 | 18000 | 30% | I | 20 | 60 | — | — |
| Ex. 8 | II | 25 | 19000 | 10% | II | 20 | 50 | 5 | 5 |
| Ex. 9 | I | 10 | 18000 | 30% | I | 50 | 30 | — | — |
| Ex. 10 | — | — | — | — | I | 45 | 40 | 5 | — |
| C. Ex. 1 | — | — | — | — | I | 30 | 60 | — | — |
| C. Ex. 2 | — | — | — | — | II | 50 | 30 | 10 | — |

TABLE 2

|  | Haze of organic component-applied film (%) | Weight ratio (500° C./1000° C.) | Maximum stress (MPa) | Reflectance (%) | Defect(s) | Operating voltage |
| --- | --- | --- | --- | --- | --- | --- |
| Ex. 1 | 0.2 | 1.01 | 6 | 20 | 0 | Stable |
| Ex. 2 | 0.3 | 1.00 | 5 | 43 | 0 | Stable |
| Ex. 3 | 70.0 | 1.00 | 4 | 20 | 4 | Stable |
| Ex. 4 | 15.0 | 1.01 | 3 | 61 | 0 | Stable |
| Ex. 5 | 0.1 | 1.03 | 13 | 20 | 4 | Slightly increased |
| Ex. 6 | 0.0 | 1.01 | 15 | 20 | 5 | Stable |
| Ex. 7 | 0.1 | 1.03 | 17 | 20 | 5 | Slightly increased |
| Ex. 8 | 0.1 | 1.00 | 4 | 79 | 3 | Stable |
| Ex. 9 | 0.2 | 1.04 | 11 | 20 | 4 | Slightly increased |
| Ex. 10 | 0.0 | 1.04 | 16 | 38 | 5 | Slightly increased |
| C. Ex. 1 | 0.0 | 1.08 | 24 | 20 | >50 | Increased |
| C. Ex. 2 | 0.0 | 1.10 | 25 | 48 | >50 | Increased |

Subsequently, a phosphor was applied between the adjacent barrier ribs in the display member. The application of the phosphor was performed by dispenser method, in which a paste of the phosphor was discharged from the tip of a nozzle where a hole having a bore size of 130 tum was formed. The phosphor was applied on the side walls of the barrier ribs at a post-firing thickness of 25 μm and on the dielectric layer at a post-firing thickness of 25 μm and then fired at 500° C. for 10 min. to produce a rear substrate. The rear substrate and a front substrate which had been produced separately, were stacked together with a sealing glass, and then neon gas containing 5% of xenon was filled therein so that the internal gas pressure became 66,500 Pa. A driving circuit was then connected to produce a PDP.

To evaluate the reliability of the PDP, the PDP was left to stand for 2 months without turning on and then subjected to an acceleration test at 70° C. for 48 hours. The increased voltage of the operating voltage was determined. The results are

EXAMPLES 11 TO 21, COMPARITIVE EXAMPLES 3 AND 4

A urethane, an amine compound, a monomer and a polymer solution shown in Table 3, a photopolymerization initiator (5 wt %), an organic dye (0.01 wt %) and γ-butyrolactone (5 wt %) were dissolved while heating the mixture to 50° C. to prepare an organic solution. Inorganic fine particles shown in Table 3 were added to the organic solution. The mixture was kneaded using a kneader to prepare a paste.

The haze of a film on which the organic component was applied (i.e., an organic component-applied film), the weights of the paste at 500° C. and 1,000° C., the stress of a paste coating film and the post-firing reflectance of the paste coating film were determined in the same manner as in Example 1. The determined values are shown in Table 4.

Stripe-shaped address silver electrodes (line width: 50 μm, thickness: 3 μm, pitch: 250 μm) were formed on a glass substrate (diagonal size: 42 inches), and then a dielectric layer having a thickness of 15 μm was formed thereon. The paste was applied over the dielectric layer and then dried so that the dry thickness of the paste became 90 μm.

A photomask for the formation of barrier ribs for a plasma display (stripe-shaped pattern, line width: 600 μm, pattern pitch: 1000 μm) was arranged so that every pattern line and every address electrode cross each other at right angle, and then exposed with light. In this process, a gap of 100 μm was provided between the photomask and the surface of the coating film in order to prevent the contamination of the photomask. A lowest value among the exposure levels at which no peeling of the barrier rib pattern was observed during development was defined as the minimum exposure level.

After exposure, the paste was further applied and dried to form a coating film having a dry thickness of 90 μm. A photomask (stripe-shaped pattern, line width: 30 μm, pattern pitch: 250 μm) was arranged on the coating film so that every pattern line and every address electrode became parallel to each other, and then exposed with light. After exposure, the resultant product was developed in a 0.5% aqueous ethanol amine solution and then fired at 560° C. for 15 min. In this manner, a display member was produced which had grid-shaped barrier ribs formed by the stripe-shaped barrier ribs (pitch: 250 μm, line width: 30 μm, height: 130 μm) and the auxiliary barrier ribs (pitch: 1,000 μm, line width: 600 μm, height: 60 μm). After firing, the presence of defects including peeling and line breaking was observed. The results are shown in Table 4.

Subsequently, a phosphor was applied between the adjacent barrier ribs. The application of the phosphor was performed by dispenser method, in which a paste of the phosphor was discharged from the tip of a nozzle where a hole having a bore size of 130 μm was formed. The phosphor was applied on the side walls of the barrier ribs at a post-firing thickness of 25 μm and on the dielectric layer at a post-firing thickness of 25 μm, and then fired at 500° C. for 10 min, thereby producing a rear substrate for a PDP. The rear substrate and a front substrate, which had been produced separately, were stacked together with a sealing glass, and then neon gas containing 5% of xenon was filled therein so that the internal gas pressure became 66,500 Pa. A driving circuit was then connected to produce a PDP.

To evaluate the reliability of the PDP, the PDP was left to stand for 2 months without turning on and then subjected to an acceleration test at 70° C. for 48 hours. The increased voltage of the operating voltage was determined. The results are shown in Table 4. In the results, the increased voltage was classified into three levels as follows:

stable: the voltage was increased by 1 V or less;

slightly increased: the voltage was increased by 2 to 3 V; and increased: the voltage was increased by 4 V or more.

TABLE 3

| | Urethane | | | | Amine compound | | Monomer | | Polymer solution | | Low melting glass | Filler | Oxide fine particles | Concentration of ethylenic unsaturated bond |
|---|---|---|---|---|---|---|---|---|---|---|---|---|---|---|
| | Type | Amount (%) | Weight mean M.W. | EO content | Type | Amount (%) | Type | Amount (%) | Type | Amount (%) | Amount (%) | Amount (%) | Amount (%) | |
| Ex. 11 | VII | 4 | 18000 | 30% | I | 3 | I | 3 | III | 30 | 50 | 0 | 0 | 0.45 |
| Ex. 12 | VIII | 4 | 19000 | 10% | II | 6 | — | 0 | IV | 30 | 40 | 10 | 0 | 0.83 |
| Ex. 13 | VII | 4 | 18000 | 30% | — | 0 | I | 6 | III | 30 | 50 | 0 | 0 | 0.36 |
| Ex. 14 | VIII | 0.05 | 19000 | 10% | II | 5 | II | 4.95 | III | 30 | 40 | 7 | 3 | 0.83 |
| Ex. 15 | VII | 25 | 18000 | 30% | — | 0 | — | 0 | IV | 15 | 50 | 0 | 0 | 0.25 |
| Ex. 16 | III | 4 | 42000 | 0% | I | 3 | II | 3 | V | 50 | 30 | 0 | 0 | 0.27 |
| Ex. 17 | IV | 4 | 27000 | 7% | II | 3 | I | 3 | III | 45 | 40 | 5 | 0 | 0.66 |
| Ex. 18 | V | 4 | 24000 | 80% | I | 3 | I | 3 | IV | 45 | 40 | 5 | 0 | 0.61 |
| Ex. 19 | VI | 4 | 1200 | 50% | II | 3 | II | 3 | V | 30 | 40 | 5 | 5 | 0.39 |
| Ex. 20 | — | 0 | — | — | II | 3 | II | 7 | III | 30 | 50 | 0 | 0 | 0.69 |
| Ex. 21 | — | 0 | — | — | I | 3 | I | 7 | IV | 30 | 40 | 10 | 0 | 0.61 |
| C. Ex. 3 | — | 0 | — | — | II | 10 | — | 0 | III | 30 | 60 | 0 | 0 | 1.19 |
| C. Ex. 4 | — | 0 | — | — | I | 0 | I | 5 | V | 45 | 30 | 10 | 0 | 0.15 |

TABLE 4

| | Haze of organic component-applied film (%) | Weight ratio (500° C./1000° C.) | Maximum stress (MPa) | Reflectance (%) | Minimum exposure level (mJ/cm$^2$) | Defect(s) | Operating voltage |
|---|---|---|---|---|---|---|---|
| Ex. 11 | 0.2 | 1.02 | 6 | 20 | 500 | 0 | Stable |
| Ex. 12 | 0.3 | 1.02 | 4 | 43 | 300 | 0 | Stable |
| Ex. 13 | 0.2 | 1.02 | 5 | 20 | 1100 | 0 | Stable |
| Ex. 14 | 0.3 | 1.03 | 13 | 61 | 300 | 0 | Slightly increased |
| Ex. 15 | 0.1 | 1.01 | 5 | 20 | 500 | 4 | Stable |
| Ex. 16 | 72.0 | 1.00 | 3 | 20 | 500 | 4 | Stable |
| Ex. 17 | 15.0 | 1.02 | 6 | 38 | 400 | 5 | Stable |
| Ex. 18 | 0.0 | 1.04 | 14 | 40 | 400 | 5 | Slightly increased |

TABLE 4-continued

|  | Haze of organic component-applied film (%) | Weight ratio (500° C./1000° C.) | Maximum stress (MPa) | Reflectance (%) | Minimum exposure level (mJ/cm$^2$) | Defect(s) | Operating voltage |
|---|---|---|---|---|---|---|---|
| Ex. 19 | 0.0 | 1.01 | 13 | 79 | 500 | 4 | Stable |
| Ex. 20 | 0.0 | 1.05 | 17 | 20 | 300 | 7 | Slightly increased |
| Ex. 21 | 0.0 | 1.04 | 16 | 45 | 400 | 8 | Slightly increased |
| C. Ex. 3 | 0.0 | 1.08 | 24 | 20 | 150 | >50 | Increased |
| C. Ex. 4 | 0.0 | 1.10 | 25 | 53 | 1500 | >50 | Increased |

EXAMPLES 22 TO 24, COMPARITIVE EXAMPLE 5

A urethane, an amine compound, a monomer and a polymer solution shown in Table 5, and a photopolymerization initiator (2 wt %) and an organic dye (0.01 wt %) were dissolved in each other while heating to 50° C. to prepare an organic solution. To the organic solution were added silver fine particles (mean particle size: 1.5 μm, specific surface: 1.10 m$^2$/g) (70 wt %) and bismuth borosilicate glass fine particles (3 wt %). The resultant mixture was kneaded with a kneader to prepare a paste.

The haze of a film on which the organic component was applied (i.e., an organic component-applied film), the weights of the paste at 500° C. and 1,000° C. and the stress of a paste coating film were determined in the same manner as in Example 1. The determined values for each sample are shown in Table 6.

The paste containing the silver fine particles prepared above was applied onto a glass substrate (diagonal size: 42 inches) by screen printing method to form a coating film having a thickness of 6 μm. The coating film was then exposed with light through a photomask (stripe-shaped pattern, pattern pitch: 250 μm, line width: 100 μm), and then developed in a 0.5% aqueous ethanol amine solution to form a stripe-shaped electrode pattern. The glass substrate having the processed electrode pattern was dried at 80° C. for 15 min. and then fired at 580° C. for 15 min. to form an electrode. In the electrode pattern after the firing, the presence of defects including peeling and line breaking was observed. The results are shown in Table 6.

An dielectric layer was formed on the glass substrate with the electrode. A barrier rib pattern was then formed on the dielectric layer in the same manner as in Example 11.

Subsequently, a phosphor was applied between the adjacent barrier ribs of the display member. The application of the phosphor was performed by dispenser method, in which a paste of the phosphor was discharged from the tip of a nozzle where a hole having a bore size of 130 μm was formed. The phosphor was applied on the side walls of the barrier ribs at a post-firing thickness of 25 μm and on the dielectric layer at a post-firing thickness of 25 μm, and then fired at 500° C. for 10 min, thereby producing a rear substrate for a PDP. The rear substrate and a front substrate, which had been produced separately, were stacked together with a sealing glass, and then neon gas containing 5% of xenon was filled therein so that the internal gas pressure became 66,500 Pa. A driving circuit was then connected to produce a PDP.

TABLE 5

|  | Urethane | | | | Amine compound | | Monomer | | Polymer solution | | Concentration of ethylenic unsaturated bond |
|---|---|---|---|---|---|---|---|---|---|---|---|
|  | Type | Amount (%) | Weight mean M.W. | EO content | Type | Amount (%) | Type | Amount (%) | Type | Amount (%) |  |
| Ex. 22 | VII | 4 | 18000 | 30% | I | 3 | III | 3 | III | 15 | 0.36 |
| Ex. 23 | VIII | 5 | 19000 | 10% | II | 2 | — | 3 | IV | 15 | 0.41 |
| Ex. 24 | VII | 7 | 18000 | 30% | — | 0 | III | 3 | III | 15 | 0.18 |
| C. Ex. 5 | — | 0 | — | — | II | 9 | — | 1 | IV | 15 | 1.05 |

TABLE 6

|  | Haze of organic component-applied film (%) | Weight ratio (500° C./1000° C.) | Maximum stress (MPa) | Minimum exposure level (mJ/cm$^2$) | Defect(s) |
|---|---|---|---|---|---|
| Ex. 22 | 0.2 | 1.02 | 6 | 400 | 0 |
| Ex. 23 | 0.3 | 1.02 | 7 | 450 | 0 |
| Ex. 24 | 0.2 | 1.02 | 4 | 1100 | 0 |
| C. Ex. 5 | 0.3 | 1.11 | 23 | 300 | >10 |

Polymer solution I: ethyl cellulose (a 20 wt % solution in terpineol).

Polymer solution II: polymethyl methacrylate (a 50 wt % solution in toluene).

Polymer III: a polymer consisting of styrene/methyl methacrylate/methacrylic acid copolymer (weight composition ratio: 30/30/40) to which 40 parts by weight of glycidyl acrylate was added based on 100 parts by weight of the copolymer.

Polymer solution IV: a polymer consisting of methyl methacrylate/methacrylic acid copolymer (weight composition ratio: 60/40) to which 40 parts by weight of glycidyl acrylate was added based on 100 parts by weight of the copolymer (acid value of the resin: 115 mg KOH/g).

Polymer solution V: a polymer consisting of methyl methacrylate/methacrylic acid copolymer (weight composition ratio: 82/18) (acid value of the resin: 90 mg KOH/g).

Monomer I: dipentaerythritol hexaacrylate.

Monomer II: $CH_2=C(CH_3)CO—(OCH(CH_3)CH_2)_9—OCOC(CH_3)=CH_2$.

Monomer III: Propoxylated trimethylolpropane triacrylate.

Amine I: N,N-diethylaminoethyl methacrylate.

Amine II: bis(2-hydroxy-3-methacryloyloxypropyl) n-propylamine.

Urethane I: a urethane compound which is represented by formula (1), wherein each of $R^1$ and $R^2$ is a hydrogen atom; $R^3$ is ethylene oxide-propylene oxide co-oligomer; and $R^4$ is an isophorone isocyanate residue, and which has an ethylene oxide content of 30% and the entire molecular weight of 18,000.

Urethane II: a urethane compound which is represented by formula (1), wherein each of $R^1$ and $R^2$ is a hydrogen atom; $R^3$ is ethylene oxide-propylene oxide co-oligomer; and $R^4$ is an isophorone diisocyanate residue, and which has an ethylene oxide content of 10% and the entire molecular weight of 19,000.

Urethane III: a urethane compound which is represented by formula (1), wherein each of $R^1$ and $R^2$ is a hydrogen atom; $R^3$ is butylene oxide oligomer; and $R^4$ is an isophorone diisocyanate residue, and which has an ethylene oxide content of 0% and the entire molecular weight of 42,000.

Urethane IV: a urethane compound which is represented by formula (1), wherein each of $R^1$ and $R^2$ is a hydrogen atom; $R^3$ is ethylene oxide-butylene oxide co-oligomer; and $R^4$ is an isophorone diisocyanate residue, and which has an ethylene oxide content of 7% and the entire molecular weight of 27,000.

Urethane V: a urethane compound which is represented by formula (1), wherein each of $R^1$ and $R^2$ is a hydrogen atom; $R^3$ is ethylene oxide-propylene oxide co-oligomer; and $R^4$ is an isophorone diisocyanate residue, and which has an ethylene oxide content of 80% and the entire molecular weight of 24,000.

Urethane VI: a urethane compound which is represented by formula (1), wherein each of $R^1$ and $R^2$ is a hydrogen atom; $R^3$ is ethylene oxide-propylene oxide co-oligomer; and $R^4$ is a 1,4-cyclohexylene diisocyanate residue, and which has an ethylene oxide content of 50% and the entire molecular weight of 1,200.

Urethane VII: a urethane compound which is represented by formula (1), wherein each of $R^1$ and $R^2$ is a methacrylic group; $R^3$ is ethylene oxide-propylene oxide co-oligomer; and $R^4$ is an isophorone diisocyanate residue, and which has an ethylene oxide content of 30% and the entire molecular weight of 18,000.

Urethane VIII: a urethane compound which is represented by formula (1), wherein each of $R^1$ and $R^2$ is an acrylic group; $R^3$ is ethylene oxide-propylene oxide co-oligomer; and $R^4$ is an 1,4-cyclohexylene diisocyanate residue, and which has an ethylene oxide content of 10% and the entire molecular weight of 19,000.

Low melting glass powder: composition (contents of oxides): $LiO_2$: 9%, $SiO_2$: 22%, $Al_2O_3$: 23%, $B_2O_3$: 33%, BaO: 4%, ZnO: 2% and MgO: 7% (glass transition temperature: 472° C., softening point under load: 515° C., refraction index: 1.59, mean particle size: 2.55 μm).

Filler: composition (contents of oxides): $SiO_2$: 38%, $B_2O_3$: 10%, BaO: 5%, $Al_2O_3$: 36%, ZnO: 2%, MgO: 5% and $CaO_2$: 4% (glass transition temperature: 652° C., softening point under load: 746° C., refraction index: 1.59, mean particle size: 2.4 μm).

Oxide fine particles: oxide fine particles (mean particle size: 0.005 μm)

The paste according to the present invention can be used to provide a display member having a post-firing pattern with no defects.

What is claimed is:

1. A paste comprising a urethane compound, inorganic fine particles and an organic solvent, wherein the inorganic fine particles comprise low melting glass powder having a softening point under load of from 450° C. to 600° C.

2. A paste according to claim 1, wherein the content of the inorganic fine particles in the paste is in the range of from 40 to 80 wt %.

3. A paste according to claim 1, wherein the urethane compound comprises a urethane compound having an ethylenic unsaturated group.

4. A paste according to claim 1, wherein the urethane compound has a molecular weight ranging from 15,000 to 50,000.

5. A paste according to claim 1, wherein the content of the urethane compound in the paste is in the range of from 0.1 to 20 wt %.

6. A paste according to claim 1, wherein the urethane compound contains an ethylene oxide unit.

7. A paste according to claim 1, wherein the paste further comprises a polymer having a carboxyl group.

8. A paste according to claim 7, wherein the polymer having a carboxyl group has an ethylenic unsaturated group.

* * * * *

UNITED STATES PATENT AND TRADEMARK OFFICE
CERTIFICATE OF CORRECTION

| | | |
|---|---|---|
| PATENT NO. | : 7,411,780 B2 | Page 1 of 1 |
| APPLICATION NO. | : 10/952909 | |
| DATED | : August 12, 2008 | |
| INVENTOR(S) | : Hiroko Uegaki et al. | |

It is certified that error appears in the above-identified patent and that said Letters Patent is hereby corrected as shown below:

On the title page, item [75]

Under the heading Inventors, please change "Takai" to --Takaki--

Signed and Sealed this

Eleventh Day of November, 2008

JON W. DUDAS
*Director of the United States Patent and Trademark Office*